United States Patent
Givargizov et al.

(10) Patent No.: US 6,458,206 B1
(45) Date of Patent: Oct. 1, 2002

(54) CANTILEVER WITH WHISKER-GROWN PROBE AND METHOD FOR PRODUCING THEREOF

(75) Inventors: Evgeny Invievich Givargizov; Lidiya Nikolaevna Obolenskaya; Ala Nikolaevna Stepanova; Evgeniya Sergeevna Mashkova; Michail Evgenievich Givargizov, all of Moscow (RU)

(73) Assignee: Crystals and Technologies, Ltd., Moscow (RU)

( * ) Notice: Subject to any disclaimer, the term of this patent is extended or adjusted under 35 U.S.C. 154(b) by 0 days.

(21) Appl. No.: 09/700,500

(22) PCT Filed: May 13, 1999

(86) PCT No.: PCT/RU99/00155

§ 371 (c)(1),
(2), (4) Date: Mar. 9, 2001

(87) PCT Pub. No.: WO99/58925

PCT Pub. Date: Nov. 18, 1999

(30) Foreign Application Priority Data

| May 13, 1998 | (RU) | 98109078 |
| May 13, 1998 | (RU) | 98109625 |
| Nov. 6, 1998 | (RU) | 98120202 |

(51) Int. Cl.$^7$ ............................................. C30B 25/18
(52) U.S. Cl. .................. 117/101; 117/90; 117/94; 117/97; 117/106; 117/921; 117/902; 117/935; 250/306
(58) Field of Search ................ 117/935, 101, 117/902, 921, 106, 97, 94, 90; 250/306, 423 F, 307

(56) References Cited

U.S. PATENT DOCUMENTS

| 5,856,672 A | * | 1/1999 | Ried ........................... 250/306 |
| 6,066,265 A | * | 5/2000 | Galvin et al. .................. 216/2 |
| 6,139,759 A | * | 10/2000 | Doezema et al. ............. 216/11 |

FOREIGN PATENT DOCUMENTS

| EP | 0 615 124 A1 | 9/1994 | .......... G01N/27/00 |
| JP | 2000-206126 | * 7/2000 | |

OTHER PUBLICATIONS

E.I. Givargizov, A.N. Kiselev, L.N. Obolenskaya and A.N. Stepanova, "Nanometric Tips for Scanning Probe Devices", Applied Surface Science 67 (1993) 73–81 North Holland.

* cited by examiner

Primary Examiner—Robert Kunemund
(74) Attorney, Agent, or Firm—Knobbe Martens Olson & Bear LLP

(57) ABSTRACT

AFM/STM probes are based on whiskers grown by the vapor-liquid-solid (VLS) mechanism. Silicon cantilevers oriented along the crystallographic plane (111) are prepared from silicon-on-insulator structures that contain a thin layer (111) on a (100) substrate with SiO2 interposed layer. At removal of solidified alloy globules inherent in the growth mechanism sharpening of the whiskers takes place and, in such a way, the probes are formed. Cross-sections of the wiskers grown by the mechanism on the cantilevers can be controllably changed during the growth process so that step-shaped whiskers optimal for fabrication of the probes can be prepared. Also, whiskers with expansions/contractions can be formed that are important for fabrication of probes suitable for investigations in coarse surfaces, complicated cavitites, grooves typical for semiconductor microelectronics, etc.

36 Claims, 22 Drawing Sheets

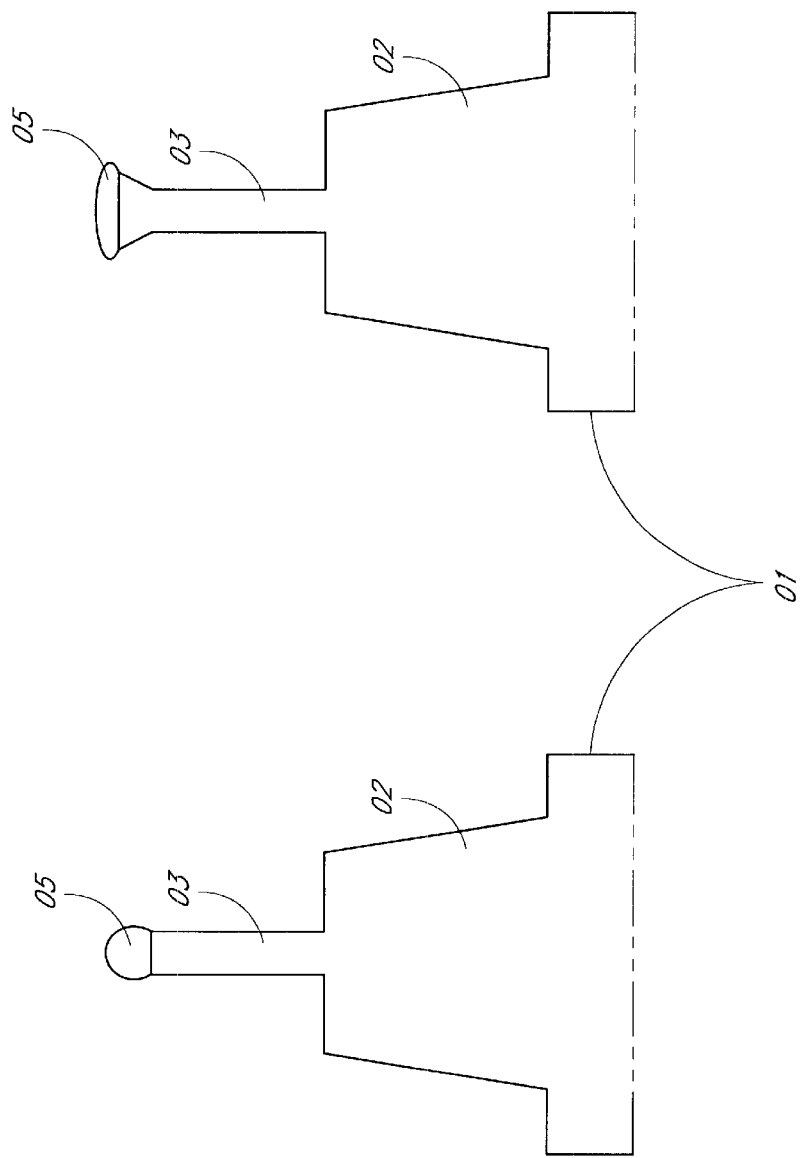

CANTILEVER WITH WHISKER-GROWN PROBE AND METHOD FOR PRODUCING THEREOF

This is the U.S. National Phase under 35 U.S.C. § 371 of International Application PCT/RU99/00155, filed May 13, 1999, which claims priority of RU/98109625, filed May 13, 1998, RU/98109078, filed May 13, 1998, and RU98120202, filed Nov. 6, 1998.

FIELD OF THE INVENTION

This invention relates to apparatus and method of forming of thin cantilevers for use in atomic force microscopes and other microscope systems.

BACKGROUND OF THE INVENTION

The scanning tunneling microscope (hereafter abbreviated STM) is a probe instrument that is able to form images of solid surfaces with high linear and spatial resolutions. This is achieved by using of ultrasharp tip (probe), that is moved at small distances above the surfaces, by registration of the tunneling currents passing between the probe and the surfaces.

The atomic force microscope (hereafter abbreviated AFM) is a probe instrument that includes a cantilever containing a holder, a lever, and a tip probe, the probe placing on the lever and having atomic sizes at least at one dimension. The cantilever moves over solid surfaces and gives their images by registration of various forces involved (van der Waals, electrostatic, magnetic, etc, ones).

In this instrument, the measurement sensitivity and the quality of the images depend decisively on characteristics and parameters of the whole cantilever, as well as of the probe and, first of all, on its detailed shape.

It is known a cantilever ("stylus") for AFM where a lever and a monolithically connected with it a tip probe are formed of an amorphous insulator such as silicon nitride, the probe having a shape of an inverted tetrahedral pyramid with angles at its apex about 110° [1]. Such probes are not suitable for investigations of coarse irregular surfaces.

It is known a cantilever for AFM containing a single-crystalline silicon tip probe on a singlecrystalline silicon lever. In such a cantilever the probe has a conical shape at all its length, including its top part, the angle at its top being 20–30°, see FIG. 1. Such a shape limits possibilities to use the cantilevers for detailed studies of microelectronic structures, e.g., grooves with vertical walls [3–5]: in such studies it is important, as a rule, to investigate simultaneously a morphology of both the vertical walls and the bottom of the grooves. "Dead zones" are formed near bottom angles of the grooves, thus, the conical probes are not suitable for the studies (FIG. 2).

At a first glance, it is possible to study the grooves having vertical walls if use small-diameter cylindrical probes. However, the resolving power of such probes and a possibility to approach by such probes closely to the walls are limited because, as the diameter of the probe is decreased, its vibration stability is catastrophically deteriorated.

The problem of the vibration of the probes can be solved if the cylindrical part of the probe is combined with a massive basis, e.i., if the probe has a "stepped" shape. Such a shape can be provided by a crystal ("whisker") growing process [6] according to the vapor-liquid-solid (VLS) mechanism, as it was described in [7], if the lower part (a "basis") of the whisker, that serves for forming of the probe, is grown at higher temperatures, while the upper part is grown at lower temperatures. However, such an approach suffer from the fact that, at the lower temperatures of the whisker growth, the crystallographic quality of the whiskers deteriorate so that the strength of the upper part of the probes can decrease that is non-desirable for such applications as AFM.

It is known a method for producing ultrafine silicon probes for the AFM/STM by etching of microstructures prepared from single-crystalline silicon by photolithographic procedures [8]. Tip shafts ("probes") are producing by reactive ion etching. Something similar to a base is formed at the lower part of the probe in order to eliminate vibrations. However, the proposed method does not allow to achieve required/optimal relationships of the upper (cylindrical tip) and the lower (thickened basis) parts of the probes, that is confirmed by drawings given in the patent [8].

Good relationships between the upper and the lower parts of the probes are achieved in [9], see FIG. 3, where the step-shaped probe is formed by focused ion beams. However, the method is complicated in implementation and is expensive.

In this invention, we propose a more simple and cheap method for production of the step-shaped probes. The method is based on the crystalline whiskers growing by the vapor-liquid-solid (VLS) process. Our method uses a special silicon-on-insulator (SOI) structure that allows to fabricate silicon cantilevers oriented along the crystallographic plane (111) necessary for growing of whiskers according to the VLS mechanism.

It is known a method for preparation of cantilevers with using of a silicon-on-insulator (SOI) structure where an oxide interposed between two silicon wafers is used as a "stop" layer at etching procedures [10]. In the method a holder and a layer of the cantilever are formed simultaneously with them. The composite SOI structure contains a layer of which the lever and the probe is subsequently formed and which is easily to treat anisotropically in a wet etch. In particular, a version is considered when the probe is formed of the silicon wafer oriented along the crystallographic plane (100).

The method [10] is illustrated in FIG. 4.

On the contrary, a wafer oriented along the crystallography plane (111) is used in the present invention. It is known, however, that such an orientation is hardly etched even at plasma ("dry") etching and especially hardly at the wet etching that is used in patent [101. In the present invention, a composite SOI structure contains at least one wafer (111) which is specially used for formation of the lever and, subsequently, of the probe.

A drawback of the patent [10] and of most of other methods for preparation of cantilever consists in the fact there the formation of the holder, of the lever, and of the probe itself is combined in a complete technological cycle. This limits strongly possibilities for formation of special shapes of the probe.

The advantage of the present invention consists in the fact that, here, the formation of the probe itself it separated of the formations of the holder ("support") and of the lever. In such a technology the formation of the probe does not depend on the procedures of the formations of the holder and of the lever.

The present invention allows to fabricate the step-shaped probe shown in FIG. 5.

An additional advantage of the lever (111) used in the present invention is that the backside of the lever can be excellently polished by an anisotropic etching that improves the measurement quality.

The present invention determines the design of the probe formed on the cantilever (111), as well as a method for its preparation. An object of the present invention is to provide the cantilever (111) for use in a scanning probe microscopy (SPM) that includes both STM and AFM.

SUMMARY OF THE INVENTION

According to this invention, it is proposed to produce a cantilever for scanning probe devices that contains a silicon holder, a lever, and a probe monolithic with the lever and perpendicular to it, the lever being implemented of silicon layer oriented on (111), and the probe being implemented of whisker grown epitaxially to the lever.

The probe has a stepped shape, contains a lower part, that serves as a basis, and an upper part, the upper part being shifted to an edge of the lever relative to the center of the basis, and the both parts having circular and/or polygonal cross-sections. The basis and the upper part are co-axial, the upper part is epitaxial in respect to the basis. The diameter of the basis of the probe exceeds the diameter of the upper part at least 10 times, the upper part of the probe having the diameter less than 100 nanometers, the curvature radius of the probe being less than 10 nanometers, and the height of the probe being more than 1 micrometer.

The cantilever according to said above where the upper part of the probe has an expansion, the diameter of the expansion exceeding the diameter of another part of the upper part at least for 20%. And the side surface of the expansion can be faceted. After that, the expansion is followed by a contraction, top of the probe can be sharpened.

The holder is implemented of a silicon wafer coated by a layer of silicon dioxide, and the layer is coated by a silicon layer oriented along the crystallographic orientation (111). The holder represents a silicon wafer oriented along the crystallographic plane (111). The lever is formed of a body having Π-shape and/or V-shape. The lever contains a cavity longitudinal to its length. The lever contains a piezoresistive layer. An electric contact to the piezoresistive layer is implemented through a silicon film doped to the level $p^{++}$.

A backside of the lever has a roughness less than 5 nanometers, and is coated by a light-reflecting material.

The cantilever contains at least two levers, at least one of them being placed on a side of the holder opposite to other ones.

The probe includes at least one $n-n^-$, $p-p^-$, or p-n junction.

The probe is coated by a stabilizing material, metal silicides being used as the stabilizing material.

The top of the probe is coated with a hard material and/or with a material lowering the electron work function. Diamond or silicon carbide are used as the hard material, whereas diamond or diamond-like carbon are used as the material lowering the electron work function.

A method for preparation of a cantilever for use in scanning probe devices is also proposed in the invention. The method includes a formation of a holder and of a lever from a silicon wafer and formation of a probe on the lever. A composite wafer is formed by bonding of two silicon wafers with an interposed oxide between them. The holder and the lever are formed from the composite wafer, and a silicon whisker probe epitaxial grown to the lever is formed. After that, the cantilever prepared is separated off the composite wafer.

At least one wafer oriented along the crystallographic plane (111) is used at the formation of the composite wafer.

After the formation of the composite wafer, a principal part of the first of the bonded wafers oriented along the plane (111) is mechanically and/or chemically removed so that a thin (111)-oriented layer is still remained. An oxide film is formed on silicon surfaces, and a part of the second of the bonded wafers is removed by etching so that a membrane of the remained first (111)-oriented layer is formed. Then, an oxide film is formed on silicon surfaces. The lever is formed of the membrane, and a whisker probe epitaxial grown to the lever is formed. Then, the cantilever prepared is separated off the composite wafer.

In another version of the method, after the formation of the composite wafer a principal part of the first of the bonded wafers oriented along the plane (111) is mechanically and/or chemically removed so that a thin (111)-oriented layer is still remained. A lever is formed from the silicon layer oriented along the plane (111), and an oxide film is formed on silicon surfaces. A part of the second of the bonded wafers is removed by etching so that a membrane of the remained first (111)-oriented layer is formed, and a whisker probe epitaxial grown to the lever is formed. Finally, the cantilever prepared is separated off the composite wafer.

In all the versions, the whisker probe can be sharpened before the separation of the cantilever.

A Π-shaped and/or V-shaped lever, as well as a lever with longitudinal cavity can be formed on the cantilevers. At the forming of the lever a piezoresistive layer and/or a $p^{++}$ contacts on the surface of the cantilever are formed by ion implantation.

Another version of the method for preparation of a cantilever for use in scanning probe devices includes a formation of a holder, of a lever from a silicon wafer oriented along the crystallography plane (111). A whisker probe epitaxially grown to the lever is formed and, after that, the cantilever prepared is separated off the composite wafer.

According to the method, before the holder and the lever are formed, a silicon membrane is formed on a side of the silicon (111) wafer by means of electrostatically screened, inductively-coupled plasma containing gaseous fluorides. The whisker probe can be sharpened before the separation of the cantilever. An Π-shaped and/or V-shaped lever, and a lever with a longitudinal cavity is formed. At the forming of the lever a piezoresistive layer and/or a $p^{++}$ contacts on the surface of the cantilever are formed by ion implantation.

In this invention also proposed a method for preparation of step-shaped silicon whisker probe that contain a lower part (basis) and upper part, by vapor-liquid-solid growth mechanism on a single-crystalline silicon substrate of crystallographic orientation (111) with using of metal solvent, and an expansion is formed at the upper part of the probe by changes of the growing temperature and/or concentration of silicon-containing gaseous compounds and/or transport agent in a vapor-gaseous mixture and/or pressure of the mixture and/or by adding of the metal solvent to the top of the whisker or its removing. Then, after the expansion of the upper part of the probe it can be contracted.

Also solidified globule of the alloy of silicon with a metal solvent that can be formed at the top of the whisker is removed by chemical etching, the whisker being sharpened. After that the probe formed is treated by an etch anisotropic in respect to silicon, faces on its surface being formed.

According to the present invention proposed a method for preparation of a step-shaped silicon whisker probe that contains a lower part serving as a basis, and upper part by growing of the whisker according to the vapor-liquid-solid mechanism on a single-crystalline silicon substrate of the crystallography orientation (111) with of a metal solvent, where a metal solvent represents a liquid alloy consisting of at least two metals. In so doing, the metals differ each of other in their vapor pressures more then by one order of magnitude.

01—a free end of the lever on that the probe is placed; 02—a low ("basis") part of the probe; 03—an upper (thin) part of the probe; D—diameter of the basis; d—diameter of the upper part: r—curvature radius of the tip probe.

Figure 7:
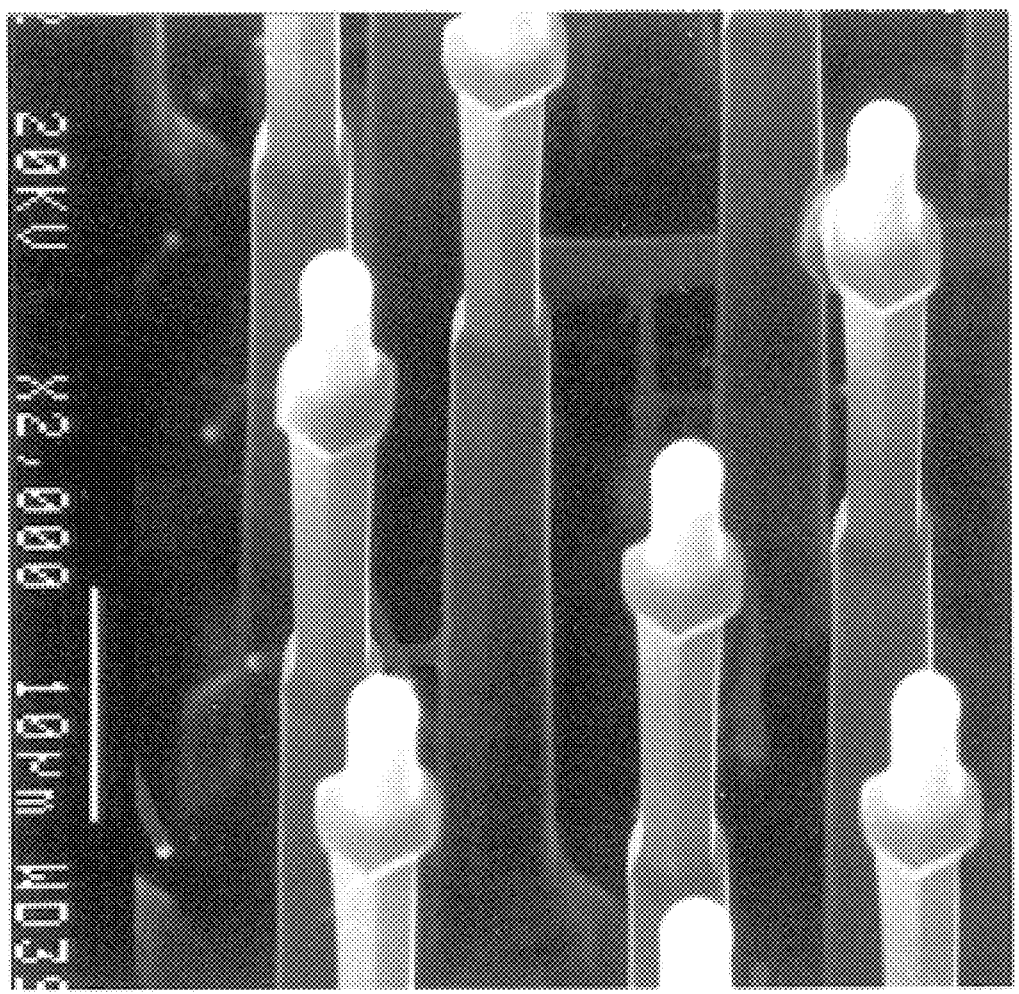

FIGS. 6a, 6b, 6c, 6. A scheme of the transformation of a whisker with a solidified globule at its top into a tip (whisker "sharpening"): a—an initial stage; b—an intermediate stage; c—a final stage; 6—a micrograph of a pre-final stage;

FIG. 7. A micrograph of oriented silicon whiskers grown by the vapor-liquid-solid mechanism with expanded intermediate parts.

FIGS. 8a, 8b. A scheme of formation of the step-shaped whisker with an expansion grown by the vapor-liquid-solid mechanism: a—an upper (contracted) part before the expansion; b—at the expanding.

Figure 9:
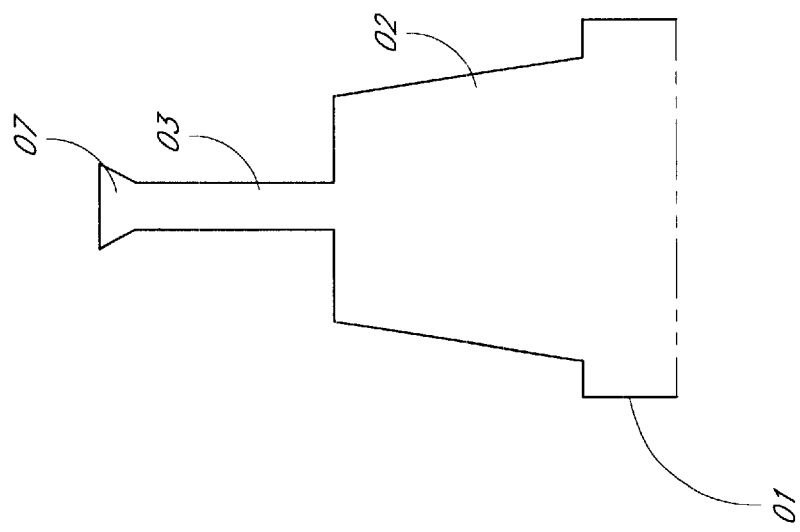

FIG. 9. A scheme of a whisker with the expanding after removing of the globule.

Figure 10:
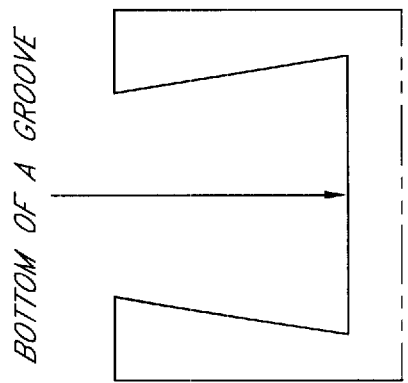

FIG. 10. A scheme of a groove expanding to the bottom.

Figures 11A, 11B:
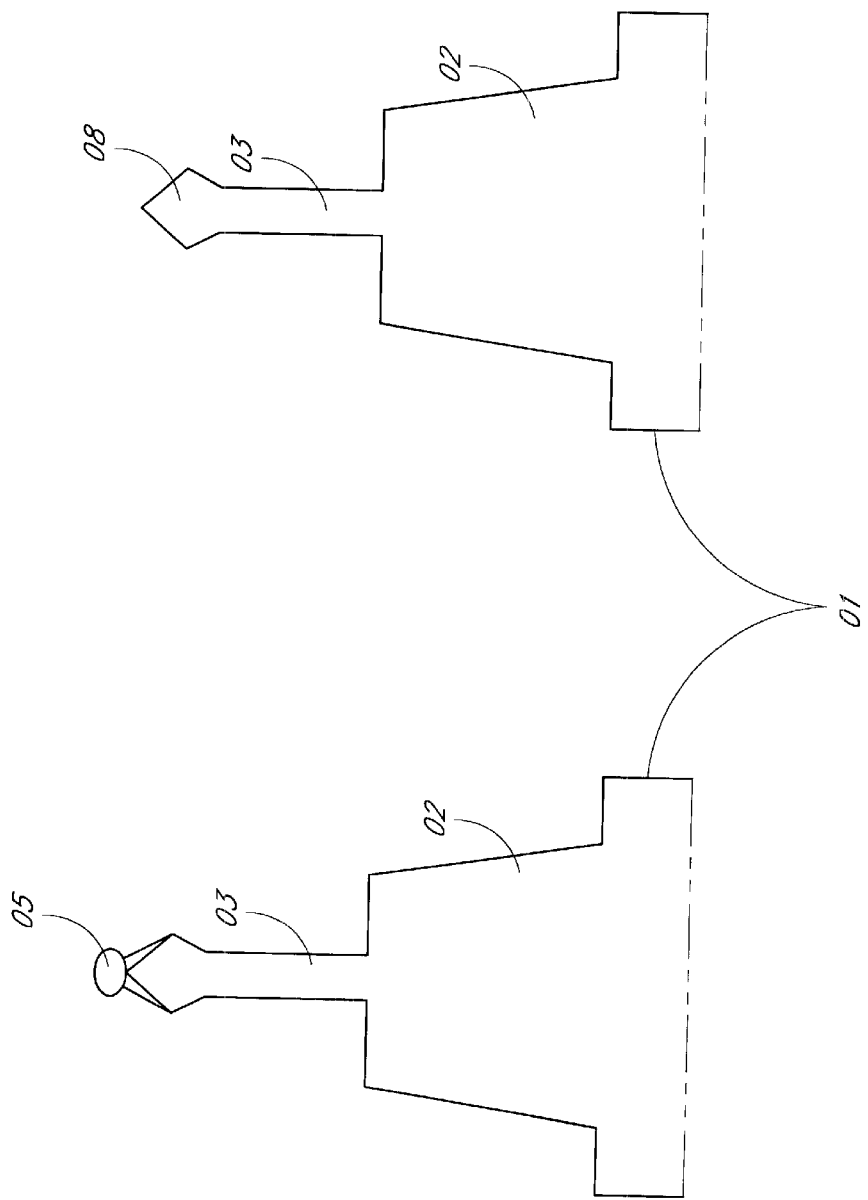
Figure 11C:
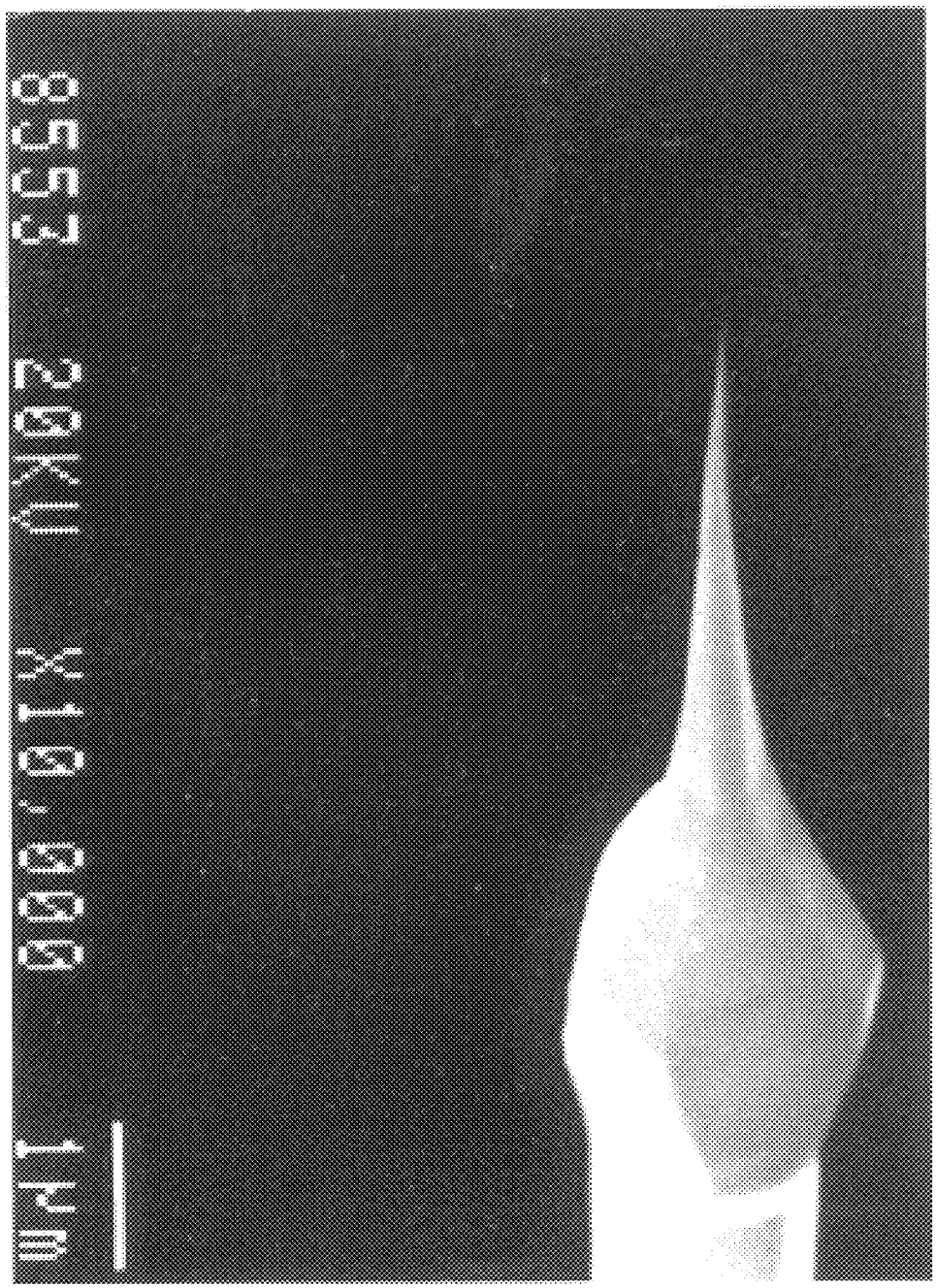

FIGS. 11a, 11b, 11c. Probes for three-dimensional measurements: a—a scheme of a whisker growing with expansion+narrowing; b—a scheme of the same whisker after sharpening; c—a micrograph of the probe for three-dimensional measurements.

Figure 12A:
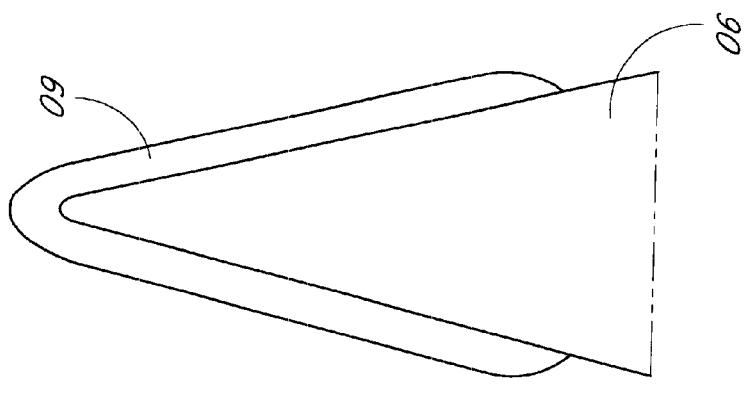
Figure 12B:
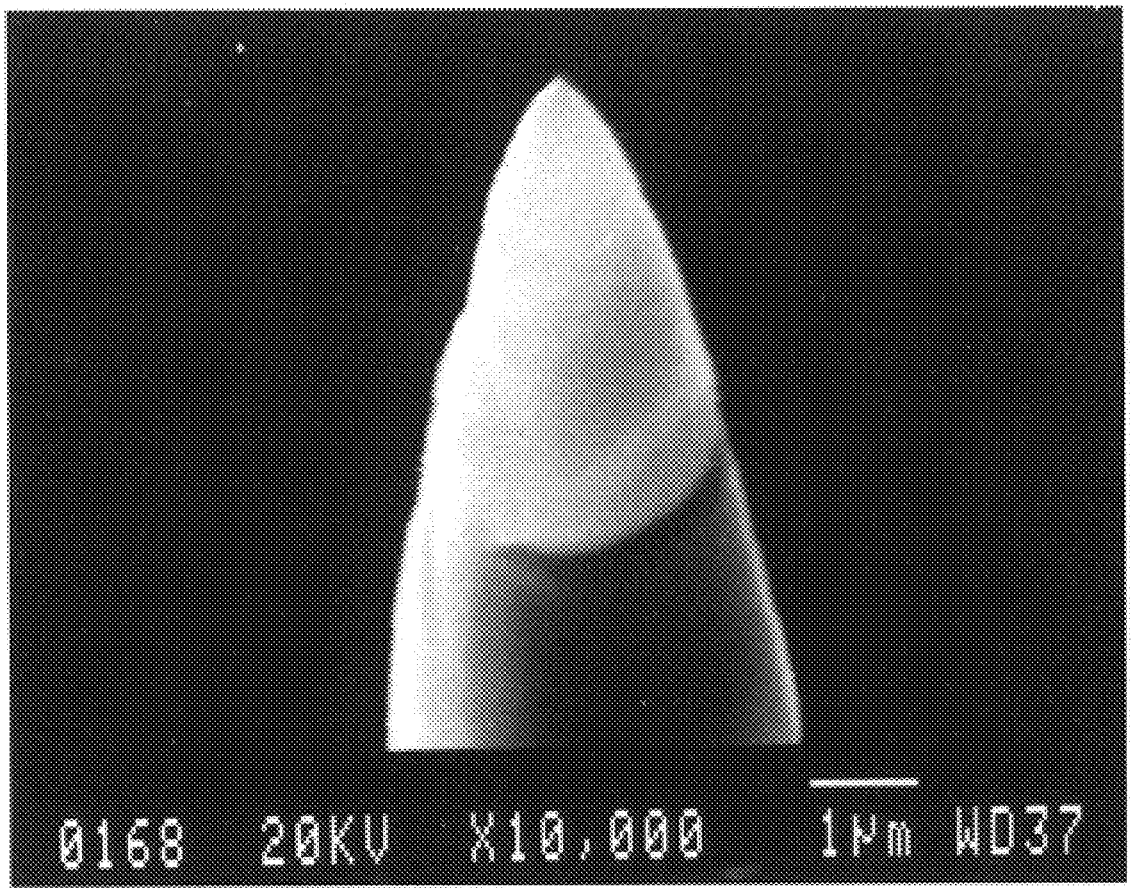

01—substrate; 02—basis of the step-shaped whisker; 03—upper (narrow) part of the whisker; 05—a globule at the step-shaped whisker; 08—3-point part of the probe;

FIGS. 12a, 12b. A silicon whisker probe coated by crystalline diamond with subsequent ion-beam sharpening of the diamond coating: a—a scheme of such a probe; b—a micrograph of the diamond probe.

Figure 13:
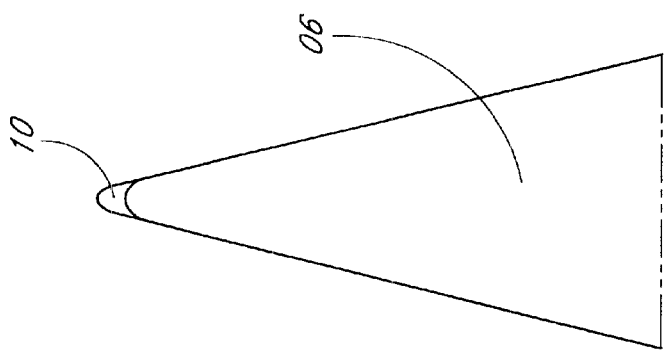

06—the body of the silicon whisker probe;
09—sharpened diamond coating;

FIG. 13. A scheme of a silicon whisker probe with a carbonized top;

10—silicon carbide.

Figure 14:
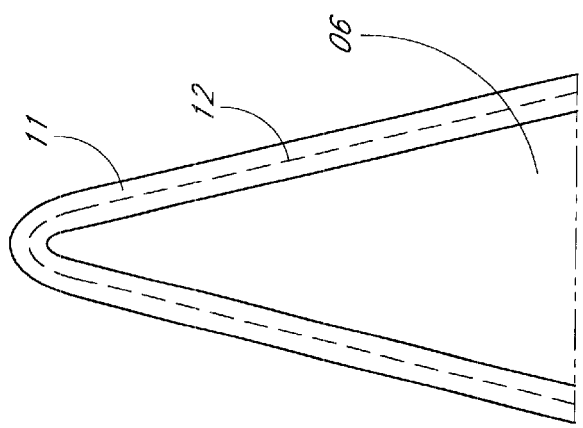

FIG. 14. A scheme of a silicon whisker probe coated by a metal silicide;

11—the silicide coating; 12—a former boundary of the silicon at the silicided probe.

Figure 15A:
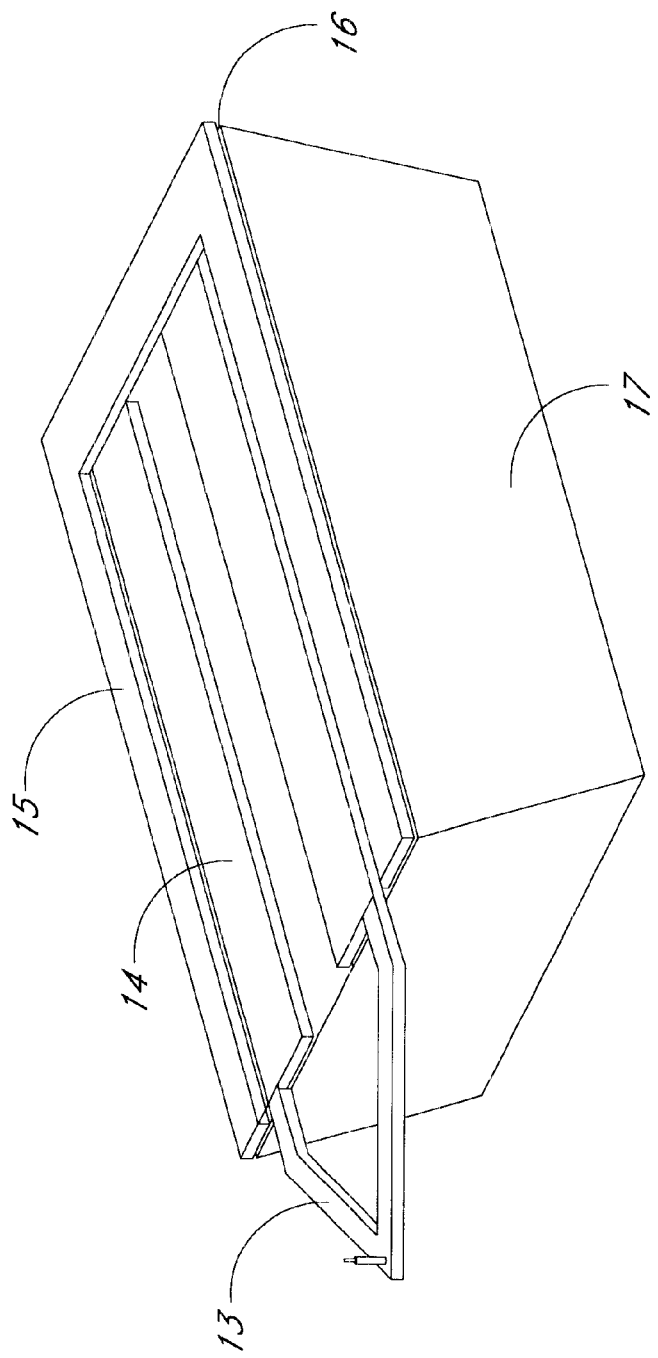
Figure 15B:
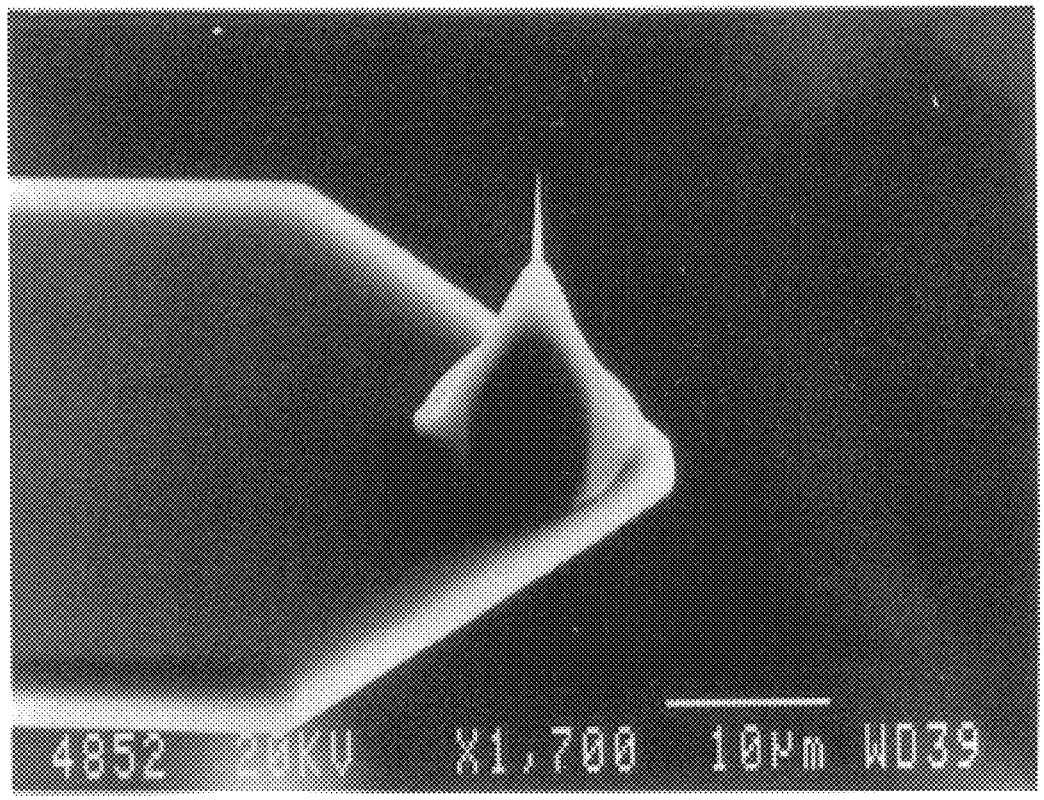
Figure 16A:
Figure 16B:
Figure 16C:
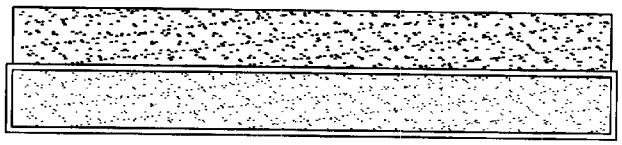
Figure 16D:
Figure 16E:
Figure 16F:
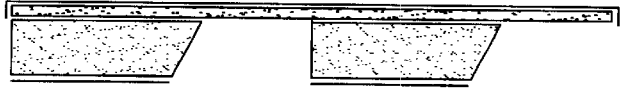
Figure 16G:
Figure 16H:
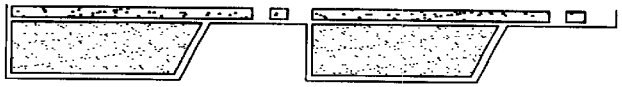
Figure 16I:
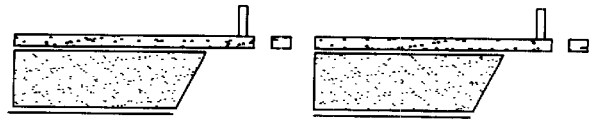
Figure 16J:
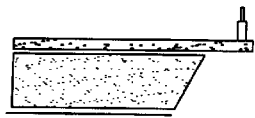
Figure 17A:
Figure 17B:
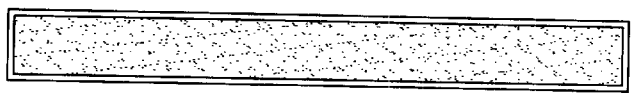
Figure 17C:
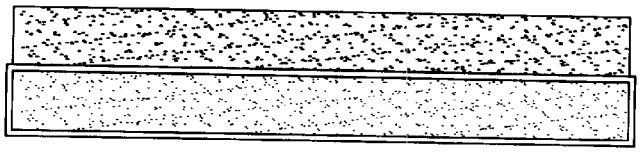
Figure 17D:
Figure 17E:
Figure 17F:
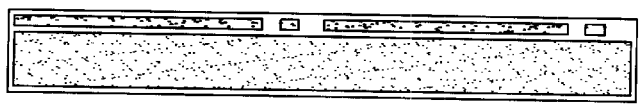
Figure 17G:
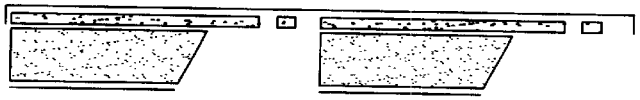
Figure 17H:
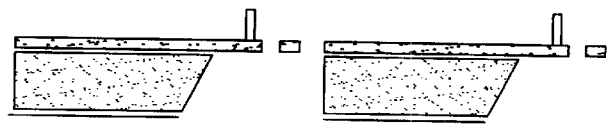
Figure 17I:
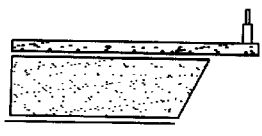

FIGS. 15a, 15b. a—a scheme of a silicon cantilever prepared from SOI structure with combined (111)+(100) orientation. The lever contains a piezoresistive layer prepared by ion implantation. The lever contains also a longitudinal cavity that divides the lever in to parts, each of the parts having electrode continuations in the body of the holder. These electrode continuations have $p^{+-}$ contacts. b—a micrograph of AFM probe prepared according to the present invention.

13—piezoresistive layer; 14—$p^{++}$ layer prepared by ion implantation; 15—silicon film oriented along crystallography plane (111); 16—separating $SiO_2$ layer; 17—silicon wafer oriented along crystallography plane (100).

FIG. 16. A version of realization of the method according to the present invention FIG. 17. Another version of realization of the method according to the present invention FIG. 18. A version of the method to implement a probe formed of silicon wafer oriented along crystallography plane (111) by means of deep plasma etching.

BEST VERSION FOR REALIZATION OF THE INVENTION

EXAMPLE 1

Figure 1:
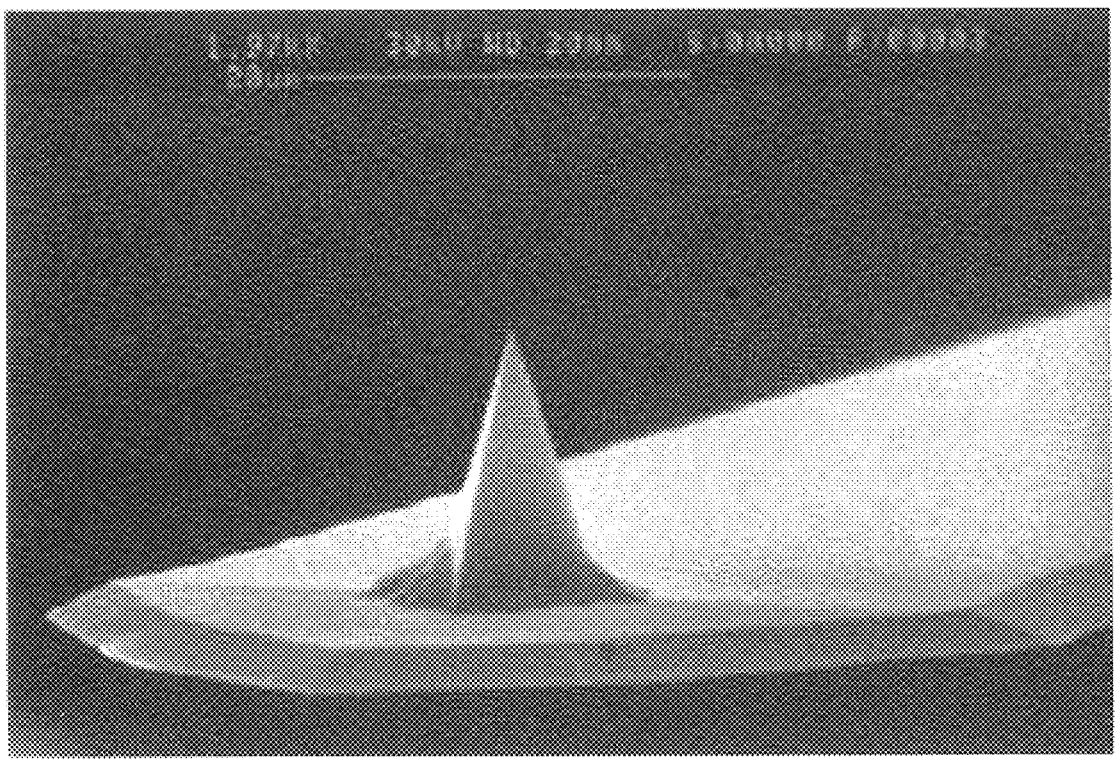
FIG. 1. Cantilever prepared according to [2].
Figure 2:
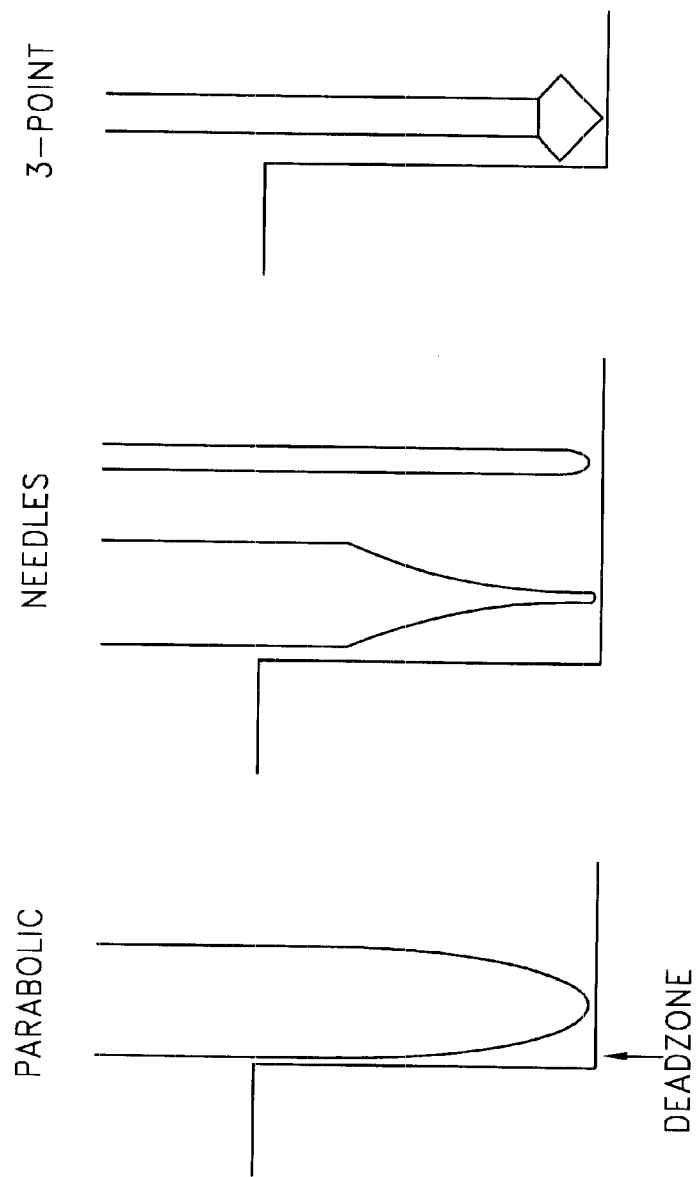
FIG. 2. Various shapes of probes used at studies of grooves according to [5].
Figure 3:
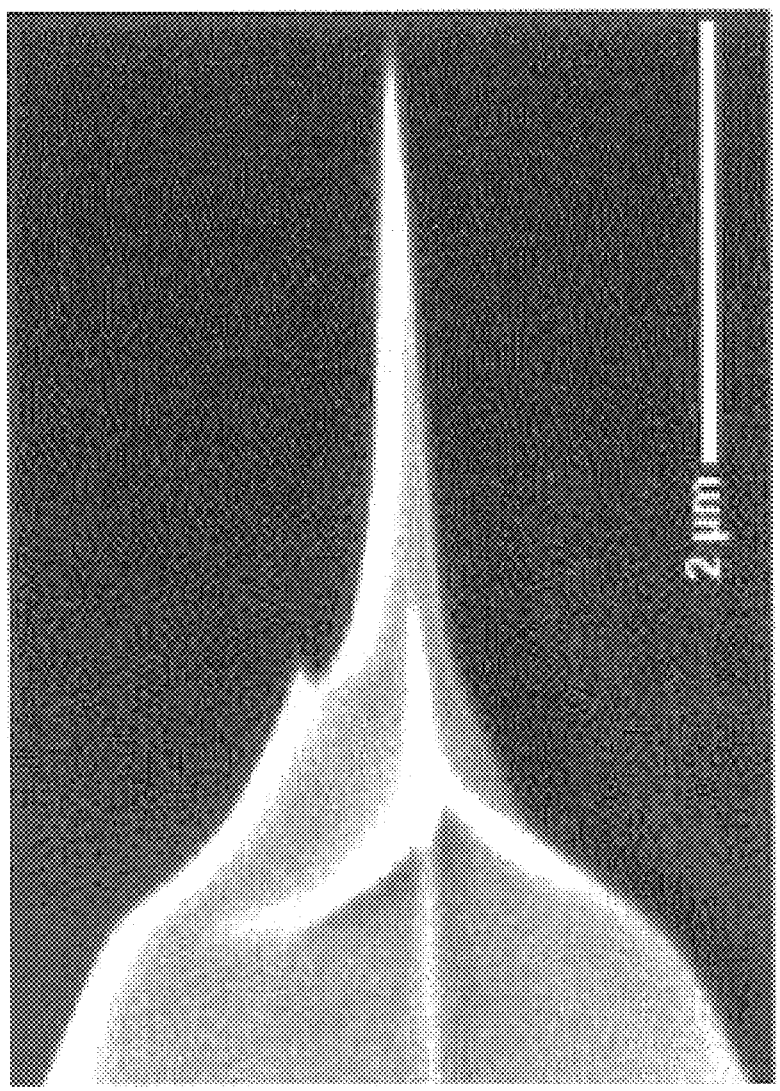
FIG. 3. A cantilever prepared according to [9].
Figure 4A:
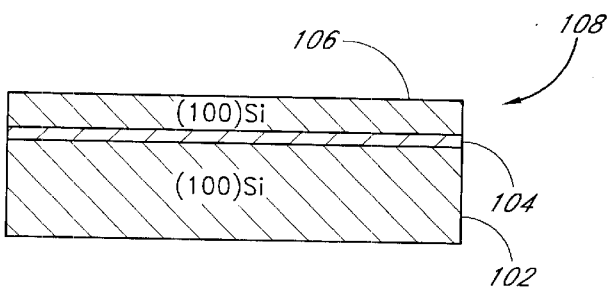
FIGS. 4a, 4b, 4c, 4d, 4e. Illustrations to the method for preparation of cantilevers according to [10]. From up to down are shown subsequent stages of the fabrication of a cantilever on a basis of SOI structure that consists of two bonded silicon wafers both having crystallographic orientation (100). 102—first silicon wafer of the orientation (100); 104—interposed oxide layer; 106—second silicon wafer of the orientation (100); 108—substrate; 110—etching mask; 111—base section of which a lever will be subsequently formed; 112—silicon oxide wall; 114—basis of which a probe will be subsequently formed; 116—pre-lever section; 118—silicon oxide film; 120—sharp probe; 122—support section; 124—V-shaped lever; 124a—backside of the lever coated with metallic film; 126—cantilever.
Figure 4B:
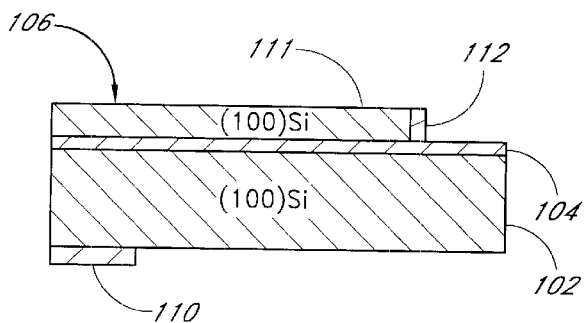
Figure 4C:
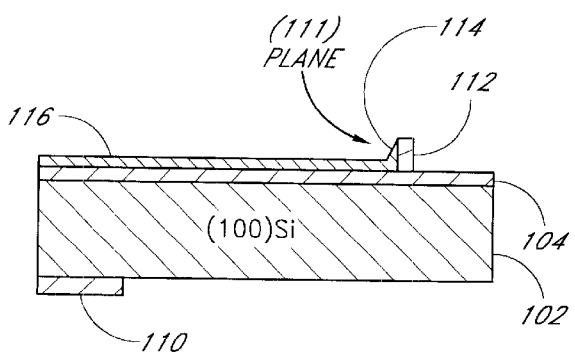
Figure 4D:
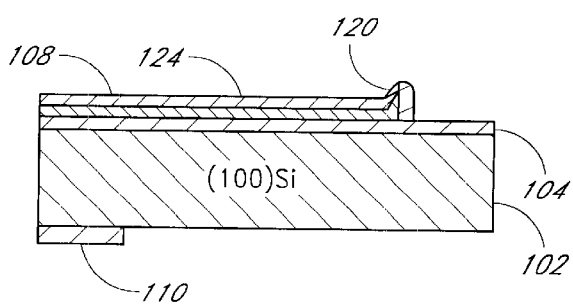
Figure 4E:
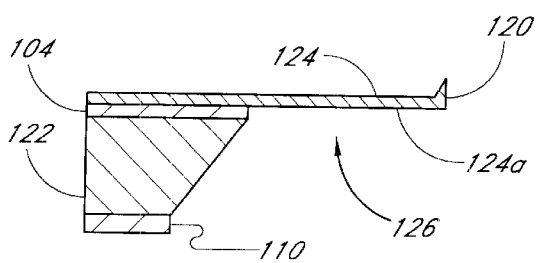
Figure 5A:
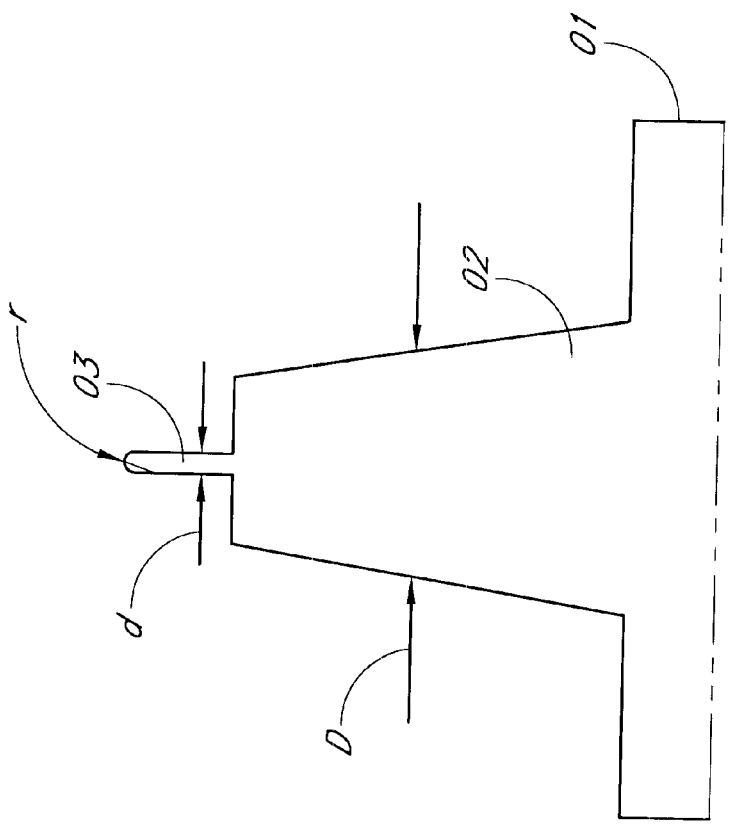
FIG. 5a, 5b. a—A scheme of a step-shaped whisker probe; b—A micrograph of the step-shaped whisker probe prepared according to the present invention.

In FIG. 15 is shown a V-shaped piezoresistive cantilever prepared at using of SOI wafers. Here, the holder (support) of the cantilever represents a silicon wafer on that a silicon dioxide $SiO^2$ is placed and coated by a silicon layer oriented along the crystallographic plane (111) of that the cantilever is implemented by a silicon film doped up to level $p^{++}$. The silicon film of that the cantilever is implemented has, as a rule, a thickness 5 to 15 $\mu$m. Down to such a thickness is thinned an initial ("first") silicon wafer (111) that is boded to another one ("second") silicon wafer at high temperatures and pressures, with subsequent mechanical grinding+ mechanical and/or chemical polishing (such a process is called "wafer bonding"). A whisker probe is placed on the lever, the probe being implemented as a tip of a stepped shape (see FIG. 5a). The lever oriented along the plane (111) as a substrate, and the whisker probe is perpendicular to the lever. This is because in the mechanism vapor liquid-solid (VLS) used for the preparation of the silicon probe [6] the crystal growth occurs by the most close-packed crystallographic plane (111). The diameter of the lower part ("basis") of the whisker probe is usually D=2 to 5 $\mu$m. The diameter is determined by a chosen size of the particle of the metal solvent that provides the local crystal growth in accordance with the VLS mechanism. The diameter of the upper part of the whisker probe can be done significantly smaller, for example d=0.1 $\mu$m=100 nanometers. The curvature radius r of the top of the tip is only about 10 nanometers or smaller (FIG. 5a). Various versions for preparation of the cantilever are given in FIG. 16, 17.

EXAMPLE 2

Figure 18:
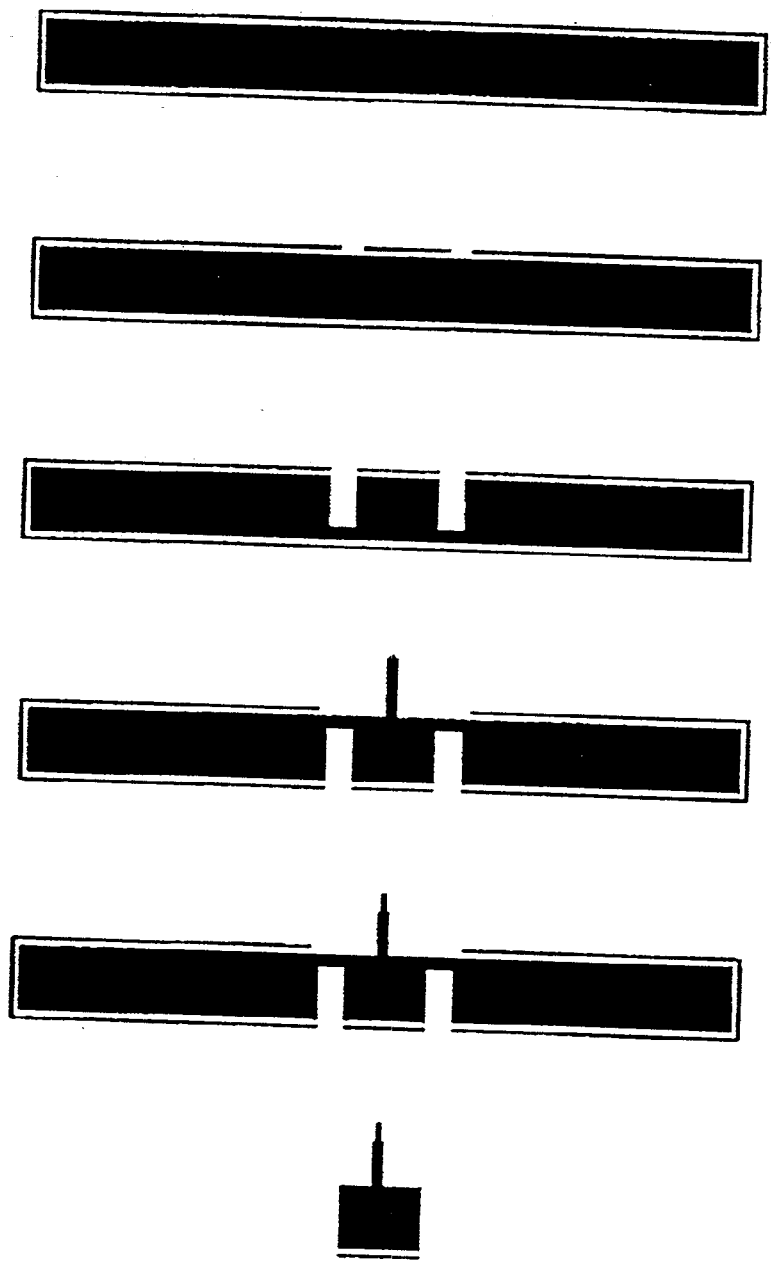

In another case the holder of the cantilever has the orientation (111), see FIG. 18. Such a version is realized if the silicon wafer (111) is used as an initial material. Such an approach needs in deep etching, that can be realized, for example, by plasma process. This is done in the present invitation by means of a special This process provides etching of single-crystalline silicon. The vertical walls being formed. In such a way, a membrane less than 15 µm in thickness is formed in relatively thick (300–400 µm) silicon wafer. From such a membrane, a lever with the orientation of the principal surface (111) is formed. Then, a metal-solvent particle is created at a given place of the substrate by photolithography, and a whisker is grown at the place. From the whisker, the whisker probe is formed.

EXAMPLE 3

The process for formation of the whiskers as mentioned above has been described in [6].

If the whisker growing process is performed at an initial stage at higher temperature and. then, at lower temperature, a step-shaped whisker is formed (FIG. 8a).

A similar effect can be obtained if, at a constant temperature of crystallization of the silicon whisker, the concentration of the whisker , the concentration of the silicon-containing gaseous compound in the gas mixture is initially increased and, then, decreased. In such a way, it is possible to grow the whisker with an expansion of its cross-section, as it is shown in FIG. 8b.

In another version, for preparation of a whisker with such a shape, the amount of the metal solvent at the top of the growing whisker is initially increased (for example, by electrochemical deposition) and, then, decreased (for example, by etching).

Subsequently, the solidified globule containing a mixture of silicon and of a solvent (for example, of gold) crystallites, is removed from the top of the whiskers, for example, by chemical etching of the silicon whisker body.

The whisker growing process is stopped at an initial stage when the whisker is expanding. Silicon whisker having the globule at its top (FIG. 8b) is oxidized in wet or in dry oxygen at 900° to 950° C. When it is treated at the fluoride aced or an aqueous solution on its basis. After that it is treated in a mixture of the nitric and hydrochloric acids. As a result, the globule is completely removed, and a plateau is formed at the whisker top, as it is shown at FIG. 9. Such a probe can be used for investigations of grooves that are expanding to their bottom.

EXAMPLE 4

Figure 6:
Figure 6C:
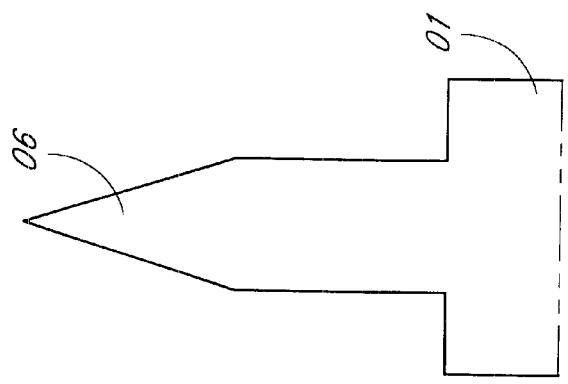
Figure 6B:
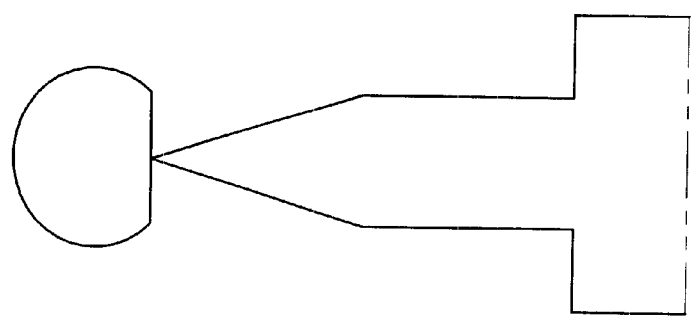
Figure 6A:
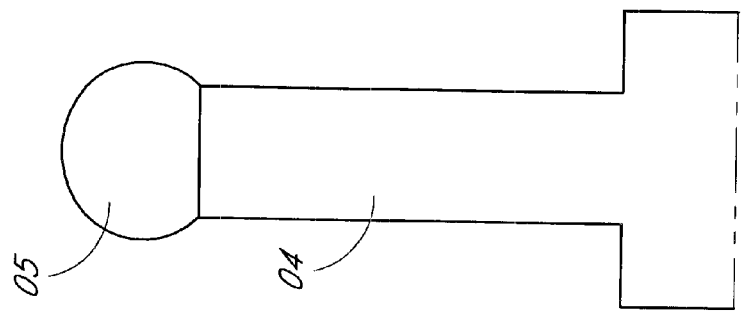

The whisker growing process is performed with the stages when it is initially expanding and then narrowing. The whisker obtaining is chemically treated by a solution that etches slowly silicon (for example. by a mixture containing fluoric, nitric, acetic acids and a sufficient amount of water). As a result of the etching, the globule is removed and simultaneously a sharpened whisker is formed (FIG. 6).

Properties of the tips that are used in the scan probe devices can be significantly improved if they are coated by crystalline diamond that is highly resistant to abrasion (that is important for AFM applications, and has a low electron work function (that is important for STM applications). The diamond can be additionally sharpened by ion milling (FIG. 12).

EXAMPLE 5

Figure 5B:
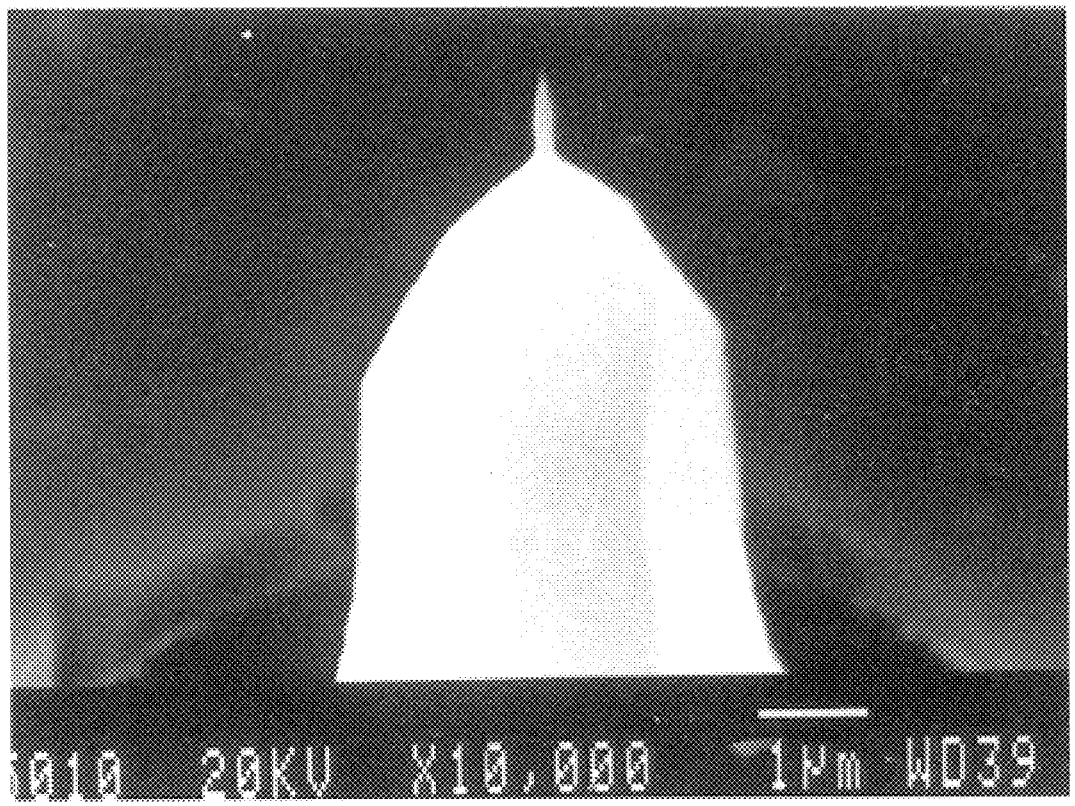

In the present invention, as a metal solving is used a liquid alloy consisting of two or more metals that are able to dissolve at the crystallization temperature more than about 1 atomic % of silicon. As the metal solvent a mixture of gold and silver used. The both metals are able to dissolve silicon at 900° C. in amounts from 30% to 50%. In the mixture alloy the solubility is of the same order. At a first stage the growing process is performed at a small concentration of the transporting agent. Then, the concentration is increasing in 5–10 times, and the growth of whisker is performed. The result is shown at FIG. 5.

In any of the described EXAMPLES of the present invention the methods indicated in [11, 12, 13] can be used in addition to the method described in [6] for formation of the epitaxially grown whiskers.

REFERENCES

1. T. R. Albrecht, Sh. Akamine, T. E. Carver, and M. J. Zdeblick, Method of forming microfabricated cantilever stylus with integrated pyramidal tip, U.S. Pat. No. 5,221, 415 (1993), C1. H01L/21.
2. O. Wolter. Th. Bauer, and J. Greschner, J. Vac. Sci. Technol. B9, 1353 (1991).
3. K. L. Lee, D. W. Abraham, F. Secord, and L. Landstein, Submicron Si trench profiling with an electron-beam fabricated atomic force microscope tip, J. Vac. Sci. Technol. B9, 3652–3568 (1991).
4. Y. Martin and H. K. Wickramasinghe, Method for imaging sidewalls by atomic forcemicroscopy, Appi. Phys. Lett. 64, 2498–2500 (1994).
5. D. Nyyssonen. L. Landstein, and E. Coombs, Two-dimensional atomic force microprobe trench metrology system J. Vac. Sci. Technol. B9, 3612–3616 (1991).
6. E. I. Givargizov. Method and apparatus for growing oriented whisker arrays, Russian Patent No. 2099808, issued 20.12.1997 (priority Apr. 01, 1996), C1.
7. E.I. Givargizov, A. N. Kiselev, L. N. Obolenskaya, and A. N. Stepanova, Nanometric tips for scanning probe devices, Appl. Surf Sci. 67, 73–81 (1993).
8. T. Bayer, J. Greschner, Y. Martin, H. Weiss, H. K. Wikramasinghe, and O. Wolter, Method of producing ultrafine silicon tips for AFM/STM profilometry, U.S. Pat. No. 5,242,541 (1993), C1. H01L 21.
9. J. Thornton and M. Wendman, Digital Instruments Nanovations 4, No. 1, p. 4 (1994).
10. Katsuhiro Matsuyama (Olympus Optical Co., Ltd.) Cantilever for use in a scanning probe microscope and method of manufacturing the same, U.S. Pat. No. 5,811, 017. Sep. 22, 1998, C1. H01L21/306.
11. Yoshinori Terui, Ryuichi Terasaki, Method for producing single crystal, and needle-like single crystal, U.S. Pat. No. 5,544,617 Date of patent Aug. 13, 1996.
12. Didier Pribat et al, Method for the controlled growth of crystal whiskers and application thereof to the making of tip microcathodes.
13. Michio Okajima et al, Fabrication method of fine structures, U.S. Pat. No. 5,381,753 Date of patent Jan. 17, 1995.

What is claimed is:

1. A cantilever for scanning probe devices that contains a silicon holder, a lever, and a probe monolithic with the lever and perpendicular to it, wherein the holder is implemented of a silicon wafer coated by a layer of silicon dioxide, and the layer is coated by a silicon layer oriented along the crystallographic orientation;

the lever is implemented of the silicon layer oriented on the crystallographic orientation; and the probe is implemented of whisker grown epitaxially to the lever.

2. The cantilever according to the claim 1, wherein the probe has a stepped shape, contains a lower part, that serves as a basis, and an upper part.

3. The cantilever according to the claim 2, wherein the upper part is shifted to an edge of the lever relative to the center of the basis, the both parts having circular and/or polygonal cross-sections.

4. The cantilever according to the claim 2, wherein the basis and the upper part are co-axial, the upper part is epitaxial in respect to the basis, the both parts having circular and/or polygonal cross-sections.

5. The cantilever according to claim 2, wherein the diameter of the basis of the probe exceeds the diameter of the upper part at least 10 times, the upper part of the probe having the diameter less than 100 nanometers, the curvature radius of the probe being less than 10 nanometers, and the height of the probe being more than 1 micrometer.

6. The cantilever according to claim 2, wherein the upper part of the probe has an expansion, the diameter of the expansion exceeding the diameter of another part of the upper part at least for 20%.

7. The cantilever according to the claim 6, wherein the side surface of the expansion is faceted.

8. The cantilever according to claim 6, wherein the expansion is followed by a contraction, top of the probe being sharpened.

9. The cantilever according to claim 1, wherein the lever is formed of a body having Π-shape and/or V-shape.

10. The cantilever according to claim 1, wherein the lever contains a cavity longitudinal to its length.

11. The cantilever according to the claim 10, wherein the lever contains a piezoresistive layer.

12. The cantilever according to the claim 11, wherein an electric contact to the piezoresistive layer is implemented through a silicon film doped to the level $p^{++}$.

13. The cantilever according to claim 1, wherein a backside of the lever has a roughness less than 5 nanometers.

14. The cantilever according to claim 1, wherein the backside is coated by a light-reflecting material.

15. The cantilever according to claim 1, wherein it contains at least two levers.

16. The cantilever according to the claim 15, wherein at least one lever is placed on a side of the holder opposite to other ones.

17. The cantilever according to claim 1, wherein the probe includes at least one $n-n^+$, $p-p^+$ or p-n junction.

18. The cantilever according to claim 1, wherein the probe is coated by a stabilizing material.

19. The cantilever according to the claim 18, wherein metal silicides are used as the stabilizing material.

20. The cantilever according to claim 1, wherein the top of the probe is coated with a hard material and/or with a material lowering the electron work function.

21. The cantilever according to the claim 20, wherein diamond or silicon carbide are used as the hard material.

22. The cantilever according to the claim 20, wherein diamond or diamond-like carbon are used as the material lowering the electron work function.

23. A method for preparation of a cantilever for use in scanning probe devices that includes a formation of a holder and of a lever from a silicon wafer and formation of a probe on the lever comprising the steps of:
   forming a composite wafer by bonding of two silicon wafers with an interposed oxide between them;
   forming the holder and the lever from the composite wafer;
   forming a silicon whisker probe epitaxial grown to the lever; and
   separating the prepared cantilever off the composite wafer.

24. The method according to claim 23, wherein at least one wafer oriented along the crystallographic plane is used at the formation of the composite wafer.

25. The method according to claim 24, wherein after the formation of the composite wafer, removing mechanically or chemically a principal part the first of the bonded wafers oriented along the plane so that a thin plane-oriented layer is still remained;
   forming an oxide film on silicon surfaces;
   removing a part of the second of the bonded wafers by etching so that a membrane of the remained first plane-oriented layer is formed;
   forming an oxide film on silicon surfaces;
   forming the lever of the membrane;
   forming a whisker probe epitaxial grown to the lever; and
   separating the prepared cantilever off the composite wafer.

26. The method according to claim 24, wherein after the formation of the composite wafer. removing mechanically or chemically a principal part the first of the bonded wafers oriented along the plane so that a thin plane-oriented layer is still remained;
   forming a lever from the silicon oriented along the plane;
   forming an oxide film on silicon surfaces;
   removing a part of the second of the bonded wafers by etching so that a membrane of the remained first plane-oriented layer is formed;
   forming a whisker probe epitaxial grown to the lever; and
   separating the prepared cantilever off the composite wafer.

27. The method according to claim 23, wherein the whisker probe is sharpened before the separation of the cantilever.

28. The method according to claim 23, wherein Π-shaped and/or V-shaped lever is formed.

29. The method according to claim 23, wherein a lever with a longitudinal cavity is formed.

30. The method according to the claim 29, wherein at the forming of the lever a piezoresistive layer and/or a $p^{++}$ contacts on the surface of the cantilever are formed by ion implantation.

31. A method for preparation of step-shaped silicon whisker probe that contain a lower part (basis) and upper part, by vapor-liquid-solid growth mechanism on a single-crystalline silicon substrate of crystallographic orientation with using of metal solvent, comprising forming an expansion at the upper part of the probe by changes of the growing temperature and/or concentration of silicon-containing gaseous compounds and/or transport agent in a vapor-gaseous mixture and/or pressure of the mixture and/or by adding of the metal solvent to the top of the whisker or its removing.

32. The method according to the claim 31, wherein after the expansion of the upper part of the probe it is contracted.

33. The method according to any of the claims 31, 32, wherein the solidified globule of the alloy of silicon with a metal solvent that are formed at top of the whisker is removed by chemical etching, the whisker being sharpened.

34. The method according to any of the claims 31–33, wherein the probe formed is treated by an etch anisotropic in respect to silicon, faces on its surface being formed.

35. A method for preparation of a step-shaped silicon whisker probe that contains a lower part serving as a basis, and upper part by growing of the whisker according to the vapor-liquid-solid mechanism on a single-crystalline silicon substrate of the crystallography orientation (111) with of a metal solvent, wherein
   a metal solvent represents a liquid alloy consisting of at least two metals.

36. The method according to the claim 35, wherein the metals differ each of other in their vapor pressures more then by one order of magnitude.

* * * * *

UNITED STATES PATENT AND TRADEMARK OFFICE
CERTIFICATE OF CORRECTION

PATENT NO.   : 6,458,206 B1                                                          Page 1 of 1
DATED        : October 1, 2002
INVENTOR(S)  : Givargizov et al.

It is certified that error appears in the above-identified patent and that said Letters Patent is hereby corrected as shown below:

<u>Column 10,</u>
Line 48, please replace "probe it is contracted" with -- probe said part is contracted --.
Line 51, please replace "that are formed" with -- that is formed --.
Line 52, please replace "the whisker being sharpened" with -- sharpening the whisker --.
Line 55, please replace "silicon, faces" with -- silicon, thereby forming faces --.
Line 55, please replace "surface being formed" with -- said probe --.
Line 57, please replace "and" with -- and an --.
Line 58, please replace "said mechanism" with -- solid growth mechanism --.
Line 59, please replace "crystallography" with -- crystallographic --.
Line 59, please replace "orientation (111) with" with -- orientation with using of --.
Line 61, please replace "of a metal" with -- said metal --.
Line 61, please replace "represents" with -- is a --.
Line 61, please replace "consisting of at least" with -- comprising --.
Line 64, please replace "differ each" of with -- differ from --.
Line 64, please replace "then" with -- than --.

Signed and Sealed this

Eighteenth Day of November, 2003

JAMES E. ROGAN
*Director of the United States Patent and Trademark Office*